United States Patent [19]
Nishizawa et al.

[11] Patent Number: 5,768,322
[45] Date of Patent: Jun. 16, 1998

[54] TRANSFERRED DATA RECOVERY APPARATUS

[75] Inventors: Akihiro Nishizawa, Kanagawa-ken; Yoshinori Tajiri, Tokyo, both of Japan

[73] Assignee: Nippon Precision Circuits Inc., Tokyo, Japan

[21] Appl. No.: 759,540

[22] Filed: Dec. 4, 1996

[30] Foreign Application Priority Data

Dec. 18, 1995 [JP] Japan .................................. 7-328708

[51] Int. Cl.$^6$ .......................... H04L 25/08; H03K 5/1252
[52] U.S. Cl. ............................. 375/346; 375/340; 327/74
[58] Field of Search .................................. 375/346, 340, 375/316; 327/93, 74, 75, 140

[56] References Cited

U.S. PATENT DOCUMENTS 4,667,338  5/1987  Toyonaga et al. .......................... 377/45
5,621,765  4/1997  Glass .......................................... 375/317

Primary Examiner—T. Ghebretinsae
Attorney, Agent, or Firm—Jordan and Hamburg

[57] ABSTRACT

A transferred data recovery apparatus capable of recovering transferred data from a transferred data signal has a first comparator for comparing transferred data signal with a reference level R to output binary-quantized data signal representing whether or not the transferred data signal is higher than the reference level R. A sample and hold circuit is driven by a clock signal and samples the binary quantized data signal each clock period to output sampled digital data to an averaging circuit. The averaging circuit sequentially averages a predetermined number of the sampled digital data each clock period to produced averaged outputs. A second comparing circuit digitally compares the averaged outputs against an upper reference level and a lower reference level dependent upon the direction of change to produce a recovered data output. The recovered data output goes low when the averaged output goes lower than the lower reference level and goes high when the averaged output goes above the upper reference level.

5 Claims, 5 Drawing Sheets

TRANSFERRED DATA RECOVERY APPARATUS

BACKGROUND OF THE INVENTION

The present invention relates to a data recovery apparatus for recovering data from data signals and, more particularly, to a data recovery apparatus having a digital comparator with a hysteresis function.

Conventional data recovery devices use a comparator to compare a data signal transferring data with a preset reference level "R" to binary-quantize the data signal. A sampler then samples the output of the comparator at a rate higher than the baud rate of the data signal in accordance with a clock signal applied to the sampler. An averaging circuit then adds a predetermined number of samplings sequentially outputted from the sampler to each other each clock period to average the sampled data, and thus functions as a digital low-pass filter (LPF). Another comparator sequentially compares the output of the averaging circuit a reference value X to output a recovered digital data signal based upon the comparison result.

Where the data signal contains a noise component, it is sometimes possible that the simple binary-quantization of the data signal results in an unstable recovered digital data signal. Where the noise component occurs such that it is about the level of the comparison level of the comparator, the recovered output can repeatedly vary between "1" and "0" in response to the noise component resulting in an unstable output. Accordingly, the averaging circuit functions as a low pass filter to remove the noise produced by the binary-quantization of the data signal. However, it is possible that the noise component is at such a level that the LPF process is insufficient to provide a stable recovered data signal. Therefore, there is a problem that it is rather difficult to correctly reproduce the transferred data.

SUMMARY OF THE INVENTION

An object of the present invention is to provide a transferred data recovery apparatus capable of providing a stable recovered date signal when a noise component of an input data signal is at a threshold level of a comparison process, even when the level of the noise component is significant.

In accordance with the present invention, a hysteresis characteristic is used in the process comparing digital data sequentially outputted from an averaging circuit. The hysteresis characteristic makes it possible avoid instability of recovered output data associated with noise on a transferred data signal near a transition point for binary-quantization.

Briefly stated, the present invention provides a transferred data recovery apparatus capable of correctly reproducing transferred data from a transferred data signal. The data recovery apparatus has a first comparator for comparing transferred data signal with a reference level R to output binary-quantized data signal representing whether or not the transferred data signal is higher than the reference level R. A sample and hold circuit is driven by a clock signal and samples the binary quantized data signal each clock period to output sampled digital data to an averaging circuit. The averaging circuit sequentially averages a predetermined number of the sampled digital data each clock period to produced averaged outputs. A second comparing circuit digitally compares the averaged outputs against an upper reference level and a lower reference level dependent upon the direction of change to produce a recovered data output. The recovered data output goes low when the averaged output goes lower than the lower reference level and goes high when the averaged output goes above the upper reference level.

In accordance with these and other objects of the invention, there is provided a transferred data recovery apparatus comprising: first comparing means for comparing transferred data with a reference level to output first digital data binary-quantized based on the comparison with the reference level; sampling means for sequentially sampling the first digital data in accordance with a predetermined sampling clock to output second digital data; averaging means for sequentially averaging a predetermined number of the second digital data sequentially outputted from the sampling means each period of the sampling clock to output third digital data; and second comparing means for comparing the third digital data sequentially outputted from the averaging means with a first reference value and a second reference value smaller than the first reference value to output a first logic value when the third digital data is greater than the first reference value and maintain the first logic value until the third digital data is smaller than the second reference value, and to output a second logic value when the third digital data is less than the second reference value and maintain the second logic value until the third digital data is larger than the first reference value.

The present invention also includes the above embodiments wherein, in the alternative, various implementations of features of the above embodiments are incorporated. For example the averaging may be accomplished by simple adding or by weighted adding to effect a weighted average.

The above, and other objects, features and advantages of the present invention will become apparent from the following description read in conjunction with the accompanying drawings, in which like reference numerals designate the same elements, and the appended claims.

DETAILED DESCRIPTION OF THE INVENTION

Figure 5:
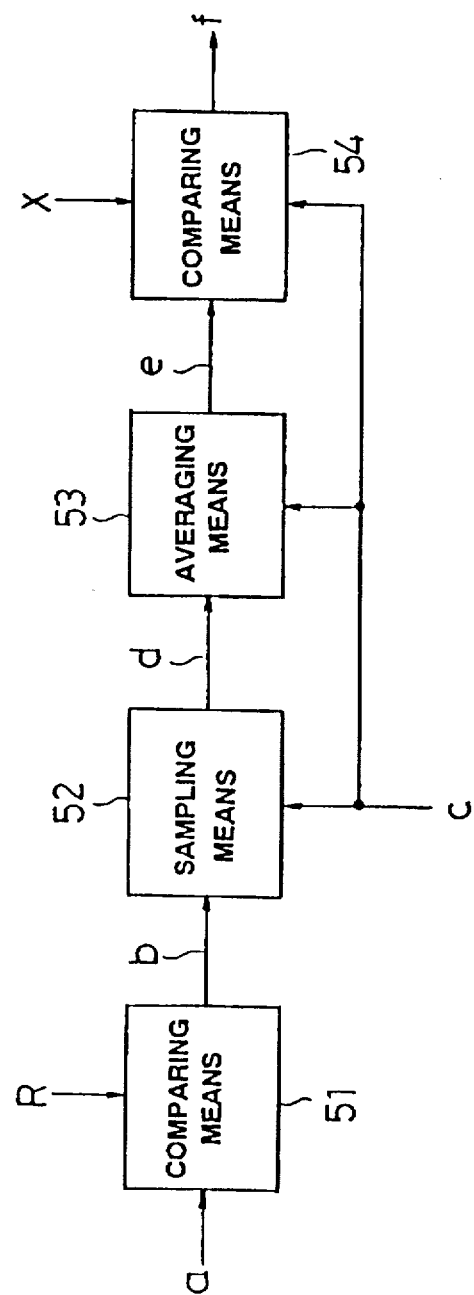
FIG. 5 is a schematic block diagram showing a conventional transferred data recovery apparatus of the prior art.

Referring to FIG. 5, a prior art data recovery apparatus has a comparing circuit 51 which compares transferred data signal "a" with a preset reference level "R" to binary-quantize the transferred data signal "a". A sampling circuit 52 samples the binary-quantized data "b" sequentially outputted from the comparing circuit 51 in response to a sampling clock "c". An averaging circuit 53 adds a predetermined number of sampled data "d" sequentially outputted from the sampling circuit 52 to each other at each sampling clock "c" to average the added data. Accordingly, the averaging circuit 53 may function as a digital low-pass filter (LPF). A second comparing circuit 54 sequentially compares the added data "e" outputted from the averaging circuit 53 with a reference value X to produce output data "f" based upon the comparison result.

Where a noise component is contained in the transferred data signal "a", problems occur only when the transferred data signal "a" is simply binary-quantized by the comparing circuit 51. If the transferred data "a" is simply binary-quantized, a phenomenon occurs where the logic value "1" and the logic value "0" are quickly and repeatedly changed in response to the noise component occurring adjacent to a transition point, or threshold, at which the logic value "1" and the logic value "0" are determined. Due to the rapid changes in the condition of the output "b", the output "b" is considered unstable. Accordingly, as indicated in FIG. 5, the LPF process is performed by the averaging circuit 53 so as to reduce occurrences of the above-described phenomenon. However, even when the LPF process is carried out in the conventional device, if the noise component is increased, then the above-described unstable factor cannot be completely eliminated.

Figure 1:
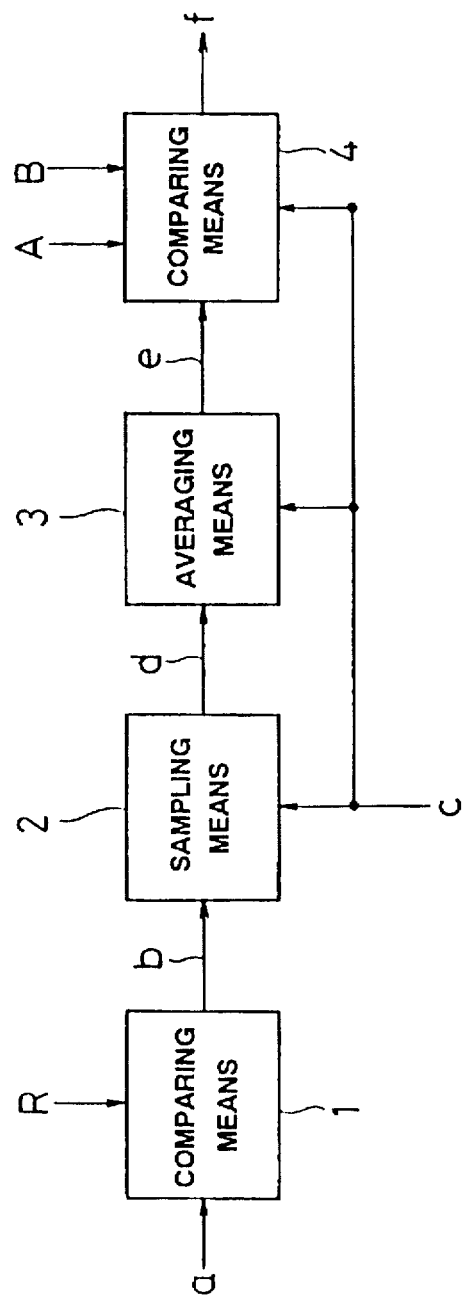
FIG. 1 is a schematic block diagram showing a transferred data recovery apparatus according to an embodiment of the present invention.
Figure 2:
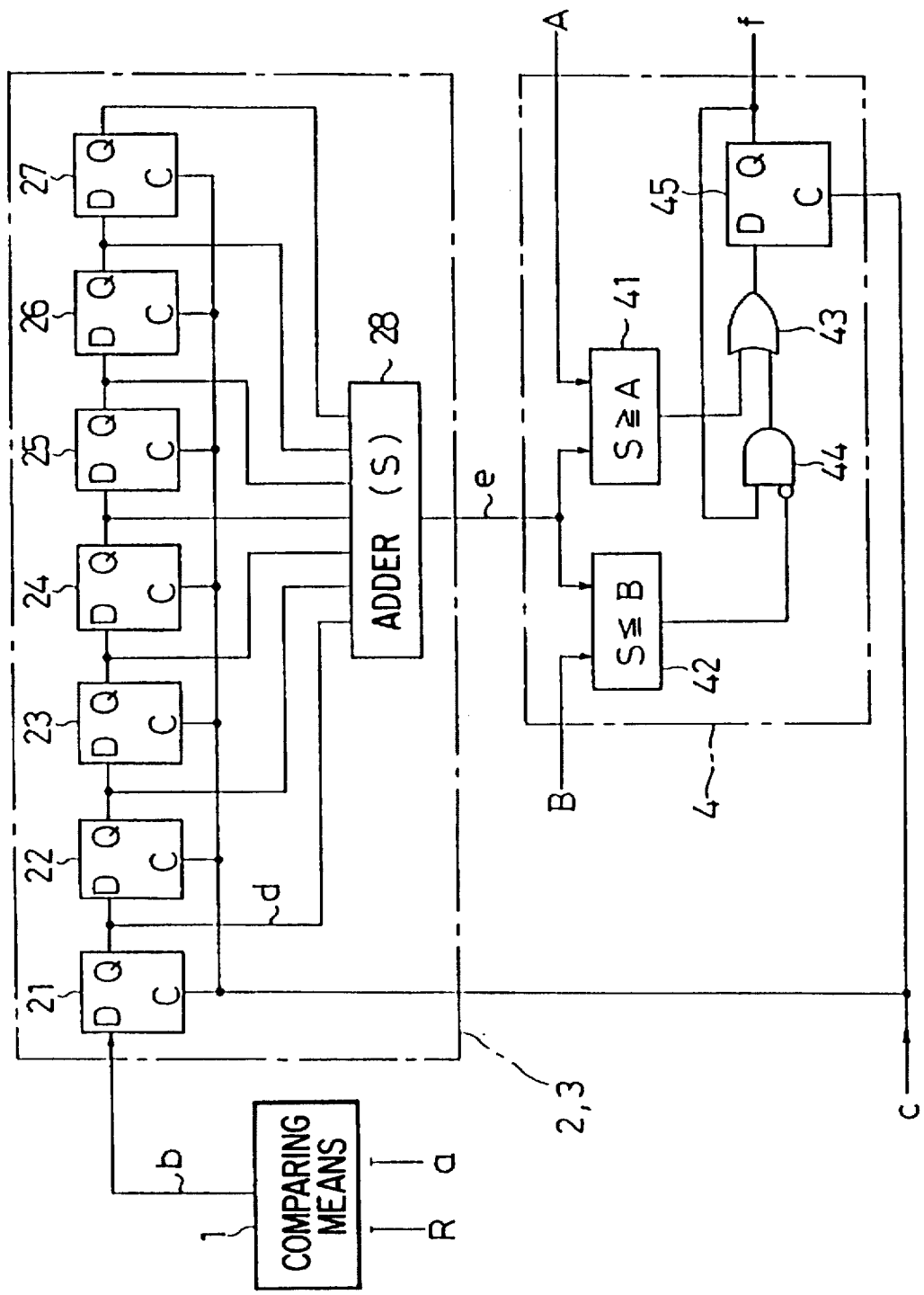
FIG. 2 is a schematic block diagram detailing circuitry of the transferred data recovery apparatus of FIG. 1.

Referring to FIGS. 1 and 2, an embodiment of a transferred data recovery apparatus of the present invention has a first comparing circuit 1 which compares transferred data signal "a" (for example, demodulated baseband waveform data) with a preset reference level "R" to binary-quantize the transferred data signal. When the transferred data signal "a" is larger than the reference level "R", the comparing circuit 1 outputs a logic value "1", whereas when the transferred data signal "a" is smaller than the reference level "R", the first comparing circuit 1 outputs another logic value "0".

A sampling circuit 2 samples the binary-quantized data "b" sequentially outputted from the comparing circuit 1 in response to a sampling clock "c" where the sampling frequency is selected to be "m" times higher than Baud rate of transferred data signal "a". The sampling circuit 2 produces sampled digital data "d" which is applied to an averaging circuit 3 that sequentially averages a predetermined number "n" (n≦m, where n=7 in this example) of the sampled digital data "d" every sampling clock "c" to thereby averaged digital data "e". The averaging circuit therefore functions as a low-pass digital filter (LPF).

Shown in FIG. 2 is an example of an embodiment of the sampling circuit 2 and averaging circuit 3 including seven D type flip-flops 21 to 27 functioning as a shift register, and an adder 28 for simply adding the output values from the respective D type flip-flops 21 to 27 (namely, adding the respective output values without weighing). As a consequence, an added value "S" obtained from the adder 28 corresponds to averaged data "e". It is realized that alternative embodiments of the sampling circuit 2 and the averaging circuit 3 may be implemented by those of ordinary skill in the art. Such variations are considered to be within the scope and spirit of the present invention.

A second comparing circuit 4 sequentially compares the digital averaged data "e", namely the added value "S", sequentially outputted from the averaging circuit 3 with a reference value A and another reference value B (A>B) every period of the sampling clock "c", and produces digital data "f" recovered from the digital average data "e" by using a comparison technique incorporating hysteresis. As indicated in FIG. 2, the comparing circuit 4 has a first comparator 41 which outputs a logic value "1" when the added value "S" is larger than, or equal to the reference value "A" (S≧A). A second comparator 42 outputs a logic value "1" when the added value "S" is smaller than, or equal to the reference value "B" (S≦B). Gates 43 and 44 accept the outputs from the first and second comparators, 41 and 42, to drive a D type flip-flop 45 in conjunction with the clock signal "c".

Figure 3:
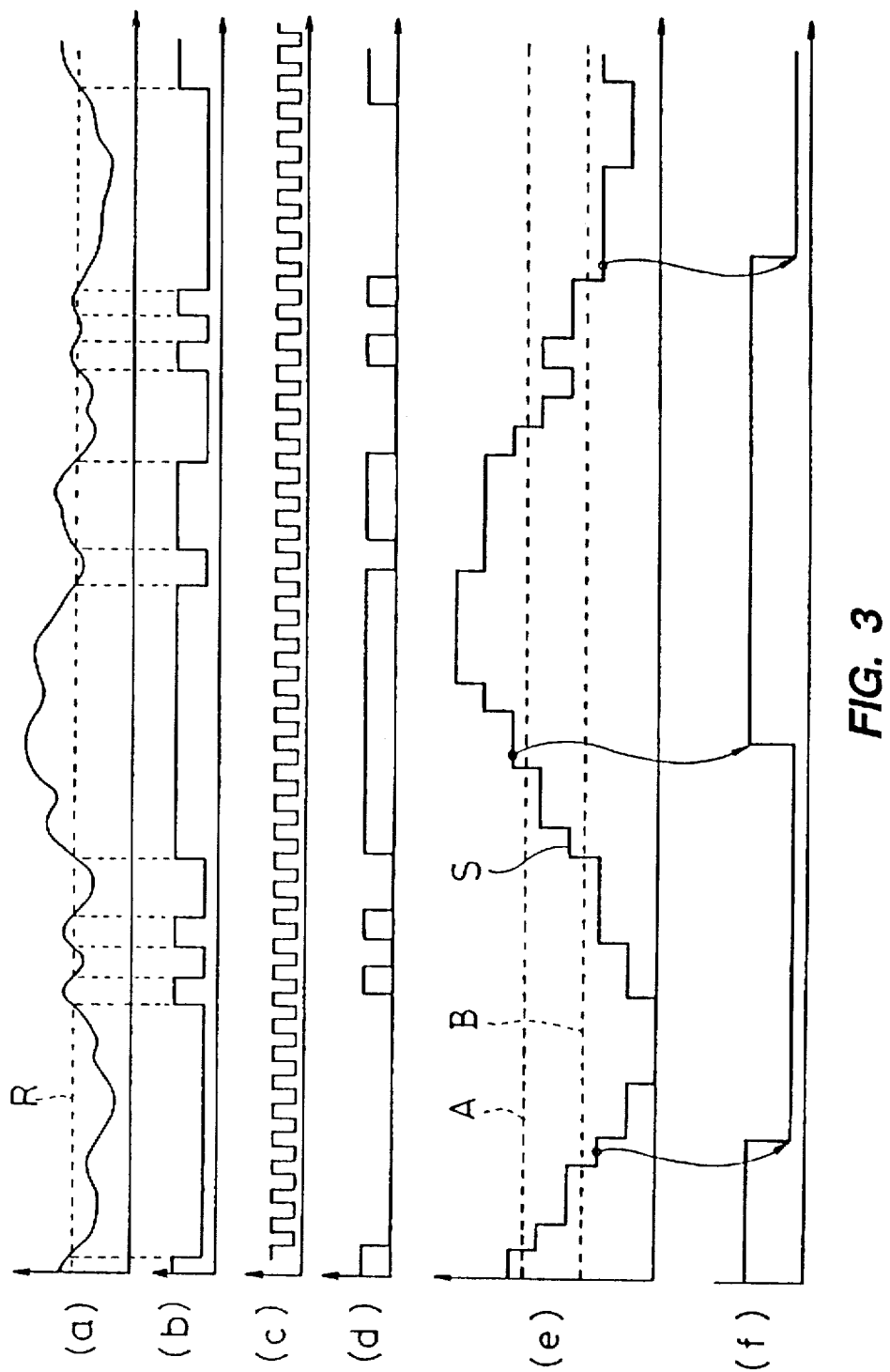
FIG. 3 is a timing chart for the apparatus shown in FIG. 1 and FIG. 2.

Referring to a timing chart shown in FIG. 3, operations of the transferred data recovery apparatus indicated in FIG. 1 and FIG. 2 are illustrated. Binary-quantization of the transferred data signal "a" containing the noise component is effected by comparison to a preset reference level "R" in the first comparing circuit 1. When the transferred data signal "a" is larger than the reference level "R", the logic value "1" is outputted from the first comparing circuit 1. When the transferred data signal "a" is smaller than the reference level "R", the logic value "0" is outputted from the first comparing circuit 1. The binary-quantized data "b" is sequentially sampled in response to a sampling clock "c", having a sampling frequency "m" times higher than the Baud rate of the transferred data signal "a". A series of samples of the binary-quantized data "b" derived from the transferred data signal "a" are latched by the D type flip-flop 21, and also are sequentially shifted by the D type flip-flops 22 to 27. Each of data "d" outputted from the D type flip-flops 21 to 27 is added to each other in the adder 28. Then, the added value "S" (data "e") is outputted from the adder 28. The data outputted from the D type flip-flops 21 to 27 for the seven sampling clocks are simple-averaged. Alternative circuit constructions are realizable by those skilled in the art and are considered to be within the scope and spirit of the present invention.

The added values "S" sequentially outputted from the adder 28 are successively compared with the reference value "A" and the reference value "B" every period of the sampling clock "c" in the second comparing circuit 4 having the hysteresis characteristic. Time lines (e) and (f) of FIG. 3 illustrated the operation performed in the second comparing circuit 4. Where "S>A", the logic value outputted from the first comparator 41 becomes "1", the logic value outputted from the second comparator 42 becomes "0", and the output "f" from the D type flip-flop becomes "1". Subsequently, where "A>S>B", although the logic value outputted from the first comparator circuit 41 becomes "0", the output "f" from the D type flip-flop is still maintained at the logic value "1" because the output at gate 43 remain at "1". Where "S<B", and the logic value of the second comparator 42 becomes "1", the output "f" of the D type flip-flop is inverted to a logic level "0". Thereafter, where "A>S>B", although the logic value from the second comparator 42 becomes "0", the output "f" of the D type flip-flop is still kept at the logic value of "0". Next, when "S>A" and the logic value outputted from the first comparator 41 becomes 1, the output of the D type flip-flop is inverted to logic level "1".

As described above, in the comparing circuit 4, while the added value "S" is present between the reference value "A" and the reference value "B", namely where the added value "S" is defined by "A>S>B", the output "f" of the D type flip-flop is maintained at the previous output state. That is, the comparing circuit 4 exhibits a the hysteresis characteristic. Therefore, since the comparing circuit 4 has the hysteresis characteristic, it is possible to prevent the output condition of the comparing circuit 4 from becoming unstable when the transferred data signal "a" has a noise component near a threshold level of comparison.

Figure 4:
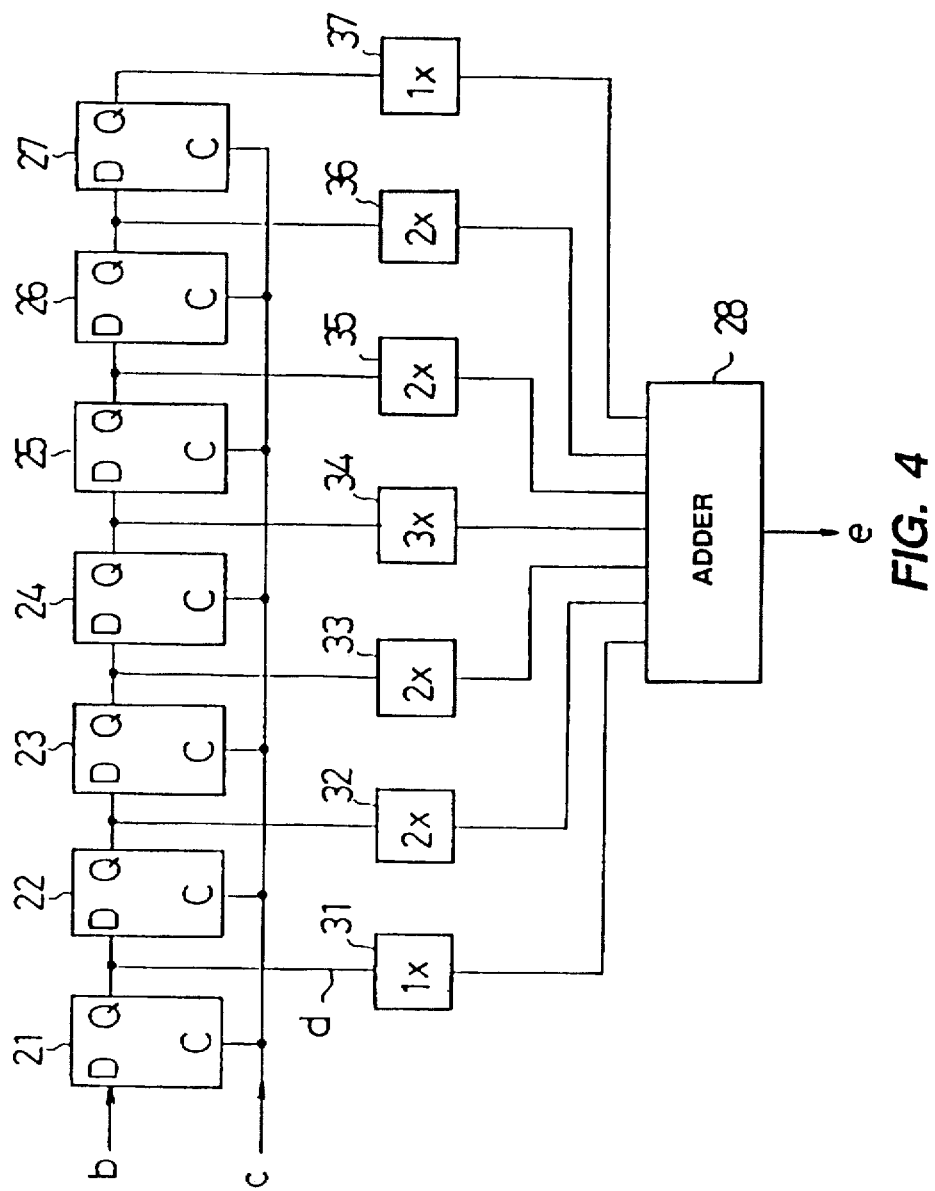
FIG. 4 is a block diagram of another embodiment of a sampling and averaging portion of the present invention.

Referring to FIG. 4, an alternative embodiment of the sampling circuit 2 and the averaging circuit 3 of FIG. 2 use a weighted adding process. In the embodiment shown in FIG. 2, the simple adding process (namely, adding process of respective output values without weighing these output values) is performed by directly inputting the respective output signals derived from the D type flip-flops 21 to 27 into the adder 28. However, as shown in FIG. 4, respective output signals from the D type flip-flops 21 to 27 are entered via multipliers 31 to 37 to the adder 28, so that the respective output values of the D type flip-flops 21 to 27 are weighted to perform the weighted adding process. Specifically, respective output values from the D type flip-flops 21 to 27 are multiplied by 1, 2, 2, 3, 2, 2, and 1 by the multipliers 31 to 37, respectively. The multiplied values are then added to each other by the adder 28. Thus, the data outputted from the D type flip-flops 21 to 27 for seven sampling clocks are weighted-averaged. Because the respective output values derived from the D type flip-flops 21 to 27 are weighted-averaged, the characteristic of the low-pass filter (LPF) is improved as is the noise eliminating characteristics of the present invention.

The transferred data recovery apparatus of the present invention provides for preventing the occurrence of unstable output conditions from comparison circuits when a transferred data signal is near the transition point for binary-quantization. As a consequence, even when a noise component contained in the transferred data is large, the transferred data is correctly reproduced.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A transferred data recovery apparatus comprising:

first comparing means for comparing transferred data with a reference level to output first digital data binary-quantized based on said comparison with said reference level;

sampling means for sequentially sampling said first digital data in accordance with a predetermined sampling clock to output second digital data;

averaging means for sequentially averaging a predetermined number of said second digital data sequentially outputted from said sampling means each period of said sampling clock to output third digital data; and second comparing means for comparing said third digital data sequential outputted from said averaging means with a first reference value and a second reference value smaller than said first reference value to output a first logic value when said third digital data is greater than said first reference value and maintain said first logic value until said third digital data is smaller than said second reference value, and to output a second logic value when said third digital data is less than said second reference value and maintain said second logic value until said third digital data is larger than said first reference value.

2. The transferred data recovery apparatus as claimed in claim 1 wherein the averaging process performed in said averaging means is a simple averaging process.

3. The transferred data recovery apparatus as claimed in claim 2 wherein the simple averaging process performed in said averaging means is a simple adding process.

4. The transferred data recovery apparatus as claimed in claim 1 wherein the averaging process performed in said averaging means is a simple weighted averaging process.

5. The transferred data recovery apparatus as claimed in claim 4 wherein the weighted averaging process performed in said averaging means is a weighted adding process.

* * * * *